(12) United States Patent
Lee

(10) Patent No.: US 12,402,485 B2
(45) Date of Patent: Aug. 26, 2025

(54) DISPLAY DEVICE COMPRISING A SPACER AND MANUFACTURING METHOD THEREOF

(71) Applicant: LG Display Co., Ltd., Seoul (KR)

(72) Inventor: Kyoungmook Lee, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 564 days.

(21) Appl. No.: 17/849,409

(22) Filed: Jun. 24, 2022

(65) Prior Publication Data

US 2022/0416193 A1 Dec. 29, 2022

(30) Foreign Application Priority Data

Jun. 24, 2021 (KR) .................. 10-2021-0082612

(51) Int. Cl.
| | |
|---|---|
| *H10K 59/122* | (2023.01) |
| *H10K 50/842* | (2023.01) |
| *H10K 59/121* | (2023.01) |
| *H10K 59/80* | (2023.01) |
| *H10K 71/00* | (2023.01) |
| *H10K 77/10* | (2023.01) |

(52) U.S. Cl.
CPC ....... *H10K 59/122* (2023.02); *H10K 50/8428* (2023.02); *H10K 59/1213* (2023.02); *H10K 59/8723* (2023.02); *H10K 77/111* (2023.02); *H10K 71/00* (2023.02)

(58) Field of Classification Search
CPC .......... H10K 50/8428; H10K 59/1213; H10K 59/122; H10K 71/00; H10K 77/111; H10K 59/8723; H10K 59/1201; H10K 59/352; H10K 59/353; H10K 59/123; H10K 71/233; H01L 27/1248; H01L 27/124; H01L 27/127; G02F 1/133305; G02F 1/133354

See application file for complete search history.

(56) References Cited

U.S. PATENT DOCUMENTS

| | | | |
|---|---|---|---|
| 8,395,569 B2 | 3/2013 | Min et al. | |
| 12,058,895 B2* | 8/2024 | Lee | ........................ H10K 50/80 |
| 2006/0055313 A1 | 3/2006 | Bae et al. | |
| 2012/0008083 A1 | 1/2012 | Tomita | |
| 2013/0057819 A1 | 3/2013 | Kurosaki et al. | |
| 2015/0077679 A1 | 3/2015 | Chen et al. | |

(Continued)

FOREIGN PATENT DOCUMENTS

| | | |
|---|---|---|
| EP | 3 660 913 A2 | 6/2020 |
| KR | 10-2014-0055529 A | 6/2014 |

(Continued)

*Primary Examiner* — J. E. Schoenholtz
(74) *Attorney, Agent, or Firm* — Birch, Stewart, Kolasch & Birch, LLP

(57) ABSTRACT

The present disclosure relates to a display device comprising a spacer and a manufacturing method thereof. The display device according to an embodiment of the present disclosure includes a thin film transistor disposed on a substrate, a bank disposed on the thin film transistor, and a spacer structure assembly including at least two spacers disposed on the bank. A first separation distance between a first separator and a second separator, among the spacers, at a first area of the display device is different from a second separation distance between the first separator and the second separator at a second area of the display device.

25 Claims, 9 Drawing Sheets

(56) References Cited

U.S. PATENT DOCUMENTS

| | | |
|---|---|---|
| 2015/0268501 A1 | 9/2015 | Hao et al. |
| 2016/0254476 A1* | 9/2016 | Park .................... H10K 50/813 |
| | | 257/40 |
| 2017/0084252 A1 | 3/2017 | Matsuo et al. |
| 2019/0094594 A1 | 3/2019 | Tong et al. |
| 2019/0212780 A1* | 7/2019 | Choi ....................... G02F 1/133 |
| 2020/0091257 A1 | 3/2020 | Sun et al. |
| 2022/0262878 A1* | 8/2022 | Lee ........................ H10K 50/80 |
| 2022/0310721 A1* | 9/2022 | Ma ......................... H10K 71/00 |

FOREIGN PATENT DOCUMENTS

| | | |
|---|---|---|
| KR | 10-2016-0026364 A | 3/2016 |
| KR | 10-2017-0012874 A | 2/2017 |
| KR | 10-2017-0080249 A | 7/2017 |
| KR | 10-2017-0128741 A | 11/2017 |
| KR | 10-2019-0029178 A | 3/2019 |
| KR | 10-2019-0057550 A | 5/2019 |
| KR | 10-2020-0051150 A | 5/2020 |
| KR | 10-2022-0090183 A | 6/2022 |
| WO | WO 2021/109682 A1 | 6/2021 |

\* cited by examiner

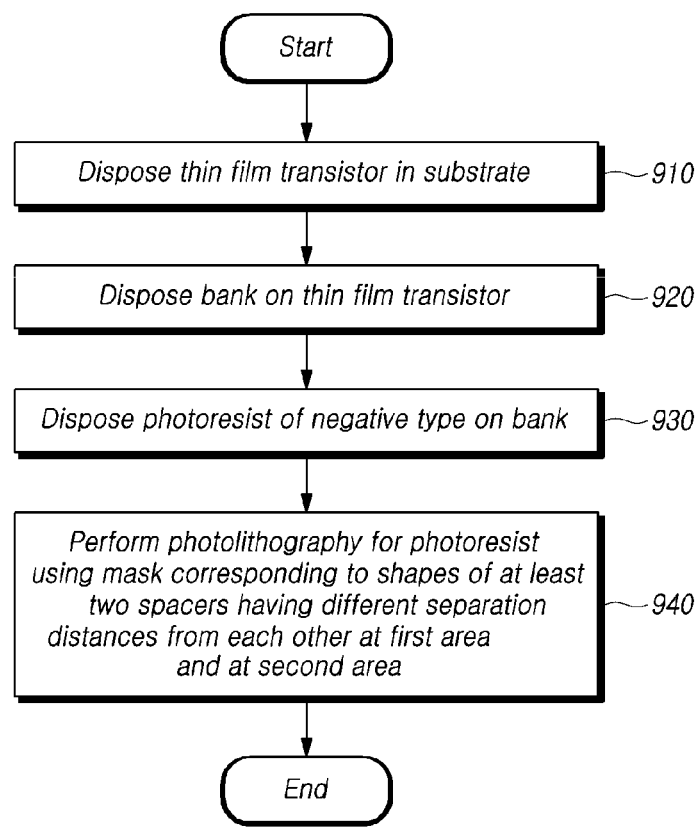

DISPLAY DEVICE COMPRISING A SPACER AND MANUFACTURING METHOD THEREOF

CROSS-REFERENCE TO RELATED APPLICATION

This application claims priority to Korean Patent Application No. 10-2021-0082612, filed in the Republic of Korea on Jun. 24, 2021, the entire contents of which are hereby expressly incorporated by reference into the present application.

BACKGROUND OF THE DISCLOSURE

Technical Field

The present disclosure relates to a display device comprising a spacer for realization of high resolution and a manufacturing method for the display device.

Discussion of the Background Art

With the development of technology, there are being developed various display devices having excellent performance such as reduction in thickness, weight reduction, and low power consumption. A specific example of such a display device can be a liquid crystal display (LCD) device, a plasma display panel (PDP) device, or an organic light emitting diode (OLED) device.

In addition, in recent years, as consumer needs for miniaturization of electronic devices increase, the development of technologies such as folding or bending of a display device is being actively pursued.

Foldable or bendable display devices, in particular foldable or bendable displays (e.g., foldable displays, rollable displays, etc.) can be subject to some pressure depending on the usage, for example, folding or bending of the display device. If certain pressure is applied to the display, the components of the display can deform. For example, stress can be generated in the folded area of a foldable display when the display is being folded or unfolded repeatedly over time. As a result, a peeling phenomenon can occur in a light emitting layer of the foldable display disposed in the foldable area.

Thus, there is a need for a method for improving an issue such as the peeling phenomenon which can occur due to the pressure applied to the display.

SUMMARY OF THE DISCLOSURE

An object of embodiments of the present disclosure is to provide a display device and a method of manufacturing the same for improving peeling of the light emitting layer which may occur due to the deformation of the display device by using, for example, an inverse tapered spacer.

However, the objects of the present disclosure are not limited to the one mentioned above, and other technical objects can be inferred from the following embodiments of the present disclosure.

In an aspect of the present disclosure, there is provided a display device including a thin film transistor disposed on a substrate, a bank disposed on the thin film transistor, and a spacer structure assembly comprising at least two spacers disposed on the bank and having different separation distances from each other at a first area and at a second area.

In another aspect of the present disclosure, there is provided a manufacturing method of a display device including disposing a thin film transistor on a substrate, disposing a bank on the thin film transistor, disposing a photoresist (for example, a photoresist of a negative type) on the bank, and performing photolithography for the photoresist by using a mask corresponding to the shape of a spacer structure assembly comprising at least two spacers having different separation distances from each other at a first area and at a second area.

In another aspect of the present disclosure, a display device includes a thin film transistor disposed on a substrate, a bank disposed on the thin film transistor, and a spacer structure assembly including at least two spacers disposed on the bank. A first separation distance between a first separator and a second separator, among the spacers, at a first area of the display device is different from a second separation distance between the first separator and the second separator at a second area of the display device.

In another aspect of the present disclosure, a manufacturing method of a display device including a spacer structure assembly, can comprise disposing a thin film transistor on a substrate, disposing a bank on the thin film transistor, disposing a photoresist on the bank, and performing photolithography on the photoresist by using a mask corresponding to a configuration of the spacer structure assembly, and thereby forming the spacer structure assembly including at least two spacers. Here, a first separation distance between a first separator and a second separator, among the at least two spacers, at a first area of the display device is different from a second separation distance between the first separator and the second separator at a second area of the display device.

The specific details of other embodiments are included in the detailed description and drawings of the present disclosure.

According to an embodiment of a display device of the present disclosure, it is possible to eliminate or minimize any deformation associated with pressure applicable to the display device, by using a spacer structure assembly comprising spacers implemented in an inverse tapered shape and arranged in at least two rows.

In addition, the display device according to one or more embodiments of the present disclosure can improve the resolution of the display device by reducing a width of a bank in the display device.

However, the effects obtainable in the present disclosure are not limited to the above-mentioned effects, and other effects not mentioned can be understood clearly to those of ordinary skill in the art to which this disclosure belongs from the description below.

BRIEF DESCRIPTION OF THE DRAWINGS

The embodiments of the present disclosure will become more fully understood from the detailed description given hereinbelow and the accompanying drawings which are given by way of illustration only, and thus are not limitative of the embodiments of the present disclosure.

FIG. 9 illustrates a flowchart for explaining a manufacturing method of a display device according to an embodiment of the present disclosure.

DETAILED DESCRIPTION OF THE EMBODIMENTS

Figure 1:
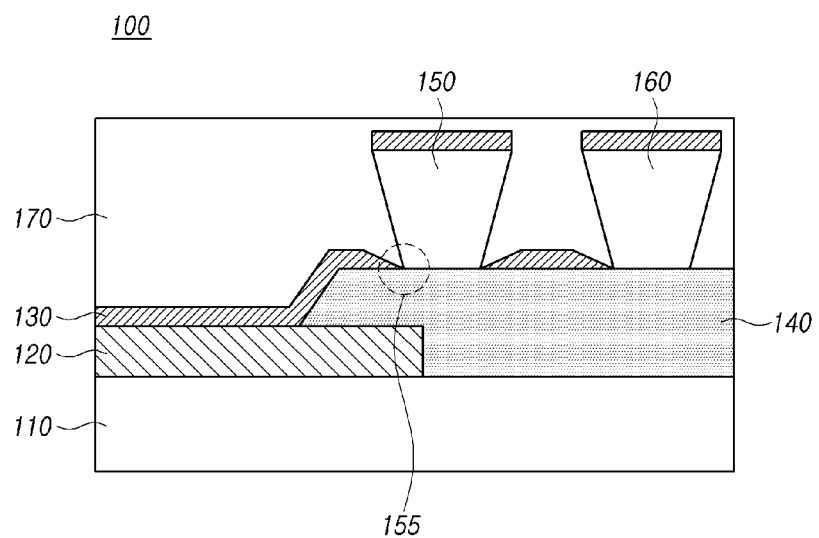
FIG. 1 schematically illustrates a cross-section of a display device according to an embodiment of the present disclosure.

The terms used in the embodiments are selected as currently widely used general terms as possible while considering the functions in the present disclosure, which can vary depending on the intention of a person skilled in the art, the precedent, or the emergence of new technology, etc. In addition, in a specific case, there is a term arbitrarily selected by the applicant, and in this case, the meaning thereof will be described in detail in the corresponding description. Therefore, the terms used in the present disclosure should be defined based on the meaning of the term and the overall contents of the present disclosure, rather than the simple name of the term.

In the entire specification, when a part "includes" a specific element, it means that other elements can be further included, rather than excluding other elements, unless otherwise stated.

The expression of "at least one of a, b, and c" described throughout the specification can include a configuration of 'a alone', 'b alone', 'c alone', 'a and b', 'a and c', 'b and c', or 'all a, b, and c'. Advantages and features of the present disclosure, and a method for achieving them will become apparent with reference to the embodiments described below in detail in conjunction with the accompanying drawings.

For simplicity and clarity of illustration, elements in the drawings are not necessarily drawn to scale. The shape, area, ratio, angle, number, etc. disclosed in the drawings for explaining the embodiments in the present specification are exemplary and the embodiments of the present specification are not limited to the illustrated matters. In addition, in describing the embodiments, if it is determined that a detailed description of a related known technology can unnecessarily obscure the gist of the embodiments, the detailed description thereof will be omitted or may be briefly provided.

In the case that the terms of 'include', 'have', 'consist', 'comprise' etc. are used in this specification, it should be understood as being able to add other parts or elements. When an element is expressed in the singular, there can be understood to include cases including the plural unless otherwise explicitly stated. In addition, in interpreting the elements, it should be interpreted as including an error range even if there is no separate explicit description.

In the description related to spatial relationship, for example, when the positional relationship of two element is described using the terms of "on", "upper", "above", "below", "under", "beneath", "lower", "near", "close", "adjacent", it should be interpreted that one or more elements can be further "interposed" between the elements unless the terms such as "directly", "only" are used. The configuration in which an element or layer is disposed "on" another element or layer includes both the case where the element or layer is disposed directly on the another element or layer and the case where still one or more other elements or layers are interposed therebetween.

When the terms, such as "first", "second", or the like, are used herein to describe various elements or components, it should be considered that these elements or components are not limited thereto. These terms are merely used herein for distinguishing an element from other elements. Therefore, a first element mentioned below can be a second element in a technical concept of the present disclosure.

The area, length, or thickness of each component described in the specification is illustrated for convenience of description, and the present invention is not necessarily limited to the area, length and thickness of the illustrated component.

The features of each of the embodiments of the present specification can be partially or wholly combined or coupled with each other, and can be various technically linked or operated. In addition, each of the embodiments can be implemented independently of each other or can be implemented together in a related relationship.

In addition, the terms to be described later are terms defined in consideration of functions in the implementation of the present specification, which can vary depending on the intention or custom of the user or operator. Therefore, the definition should be made based on the content throughout this specification.

Hereinafter, embodiments of the present disclosure will be described with reference to the drawings. All the components of a display device according to all embodiments of the present disclosure are operatively coupled and configured.

FIG. 1 schematically illustrates a cross-section of a display device according to an embodiment of the present disclosure. Specifically, FIG. 1 schematically illustrates a portion of a cross-section of a display device 100 in which inverse tapered spacers 150 and 160 are formed on a bank 140. The display device 100 includes other components for displaying images, such as pixels/subpixels, driving circuitry, etc.

Referring to the portion of FIG. 1, the display device 100 can include a substrate, a thin film transistor, a passivation layer 110, an electrode 120, an organic layer 130, a bank 140, spacers 150 and 160, and a cover layer 170.

The electrode 120 and the bank 140 can be formed on the passivation layer 110. The organic layer 130 can be formed on at least a portion of each of the electrode 120 and the bank 140. The passivation layer 110 can be implemented, for example, of PAC (photoacryl), but is not limited thereto. In some cases, the passivation layer 110 can be omitted or replaced with another configuration.

In an embodiment, at least one of the thin film transistor (TFT) and the substrate can be disposed under the passivation layer 110. For example, a thin film transistor can be disposed on a substrate, and a passivation layer 110 can be disposed on the thin film transistor. In some cases, another configuration (e.g., a buffer layer) can be further included between at least a portion of the substrate, the thin film transistor, and the passivation layer 110.

In an embodiment, the substrate can include a deformable glass or polymer substrate. In this case, the display device can be implemented to include a flexible display. However, the present disclosure is not limited thereto, and the substrate can be implemented to include a glass substrate maintaining a specific shape.

In an embodiment, the thin film transistor can include a source, a drain, and a gate, and can control the flow of current applied to the thin film transistor. The arrangement of components such as a source, a drain, and a gate constituting the thin film transistor can be implemented in various ways. For example, the thin film transistor can be implemented as a top gate method in which a gate is located at an upper portion, or can be implemented in a bottom gate method in which a gate is located at a lower portion. In addition, the thin film transistor can be implemented using various materials. For example, the thin film transistor can be implemented using at least one of a-si (or amorphous silicon) and a low-temperature polycrystalline silicon (LTPS). However, the embodiment of the present disclosure is not limited by the arrangement or material of the components of the thin film transistor.

The electrode 120 can be disposed on the passivation layer 110. The electrode 120 of FIG. 1 can be an anode, but is not limited thereto, and can be implemented as a cathode according to an embodiment.

The organic layer 130 can be disposed on the electrode 120. In an embodiment, the organic layer 130 can include a light emitting layer. The light emitting layer can be configured to emit light of a specific wavelength. In another embodiment, the organic layer 130 includes an electron injection layer (EIL), an electron transport layer (ETL), a light emitting layer, a hole transport layer (HTL), and a hole injection layer (HIL). However, the present disclosure is not limited thereto, and the organic layer 130 can include a configuration different from that of the light emitting layer.

Still referring to FIG. 1, in an embodiment, at least a portion of the bank 140 can be disposed to overlap the electrode 120. At least two spacers, for example, the first spacer 150 and the second spacer 160 can be disposed on the bank 140. The first spacer 150 and the second spacer 160 can be spaced apart from each other. In this case, the separation distance between the first spacer 150 and the second spacer 160 at a first area/location and the separation distance between the first spacer 150 and the second spacer 160 at a second area/location can be different from each other.

In an embodiment, each of the first spacer 150 and the second spacer 160 can be implemented in the form of a row (or line). In this case, the separation distance between the first spacer 150 and the second spacer 160 can be implemented in a changeable form. For example, each of the first spacer 150 and the second spacer 160 can be formed in a row having a change in width and the the first spacer 150 and the second spacer 160 can be disposed side by side on the bank 140. In this case, the separation distance between the first spacer 150 and the second spacer 160 can be inversely proportional to the width of one surface of the first spacer 150 and the second spacer 160. A more specific example related thereto will be described later with reference to FIG. 2.

Each of the first spacer 150 and the second spacer 160 can be implemented in an inverse tapered shape as shown in FIG. 1. In the case that the first spacer 150 and the second spacer 160 are implemented in an inverse tapered shape, the adhesion of the light emitting layer can be improved at an edge portion in contact with the bank 140, for example, the first point 155. Accordingly, the peeling phenomenon of the light emitting layer can be improved, thereby the quality of the display device can be improved.

In addition, since the first spacer 150 and the second spacer 160 are implemented in an inverse tapered shape, the size of the bank 140 needed for stacking the spacers 150 and 160 can be reduced, thereby the resolution of the display device can be improved.

Furthermore, as shown, in the case that the spacers 150 and 160 are implemented with a number of at least two, the number of points at which the adhesion of the light emitting layer is improved increases, so that the peeling phenomenon of the light emitting layer can be improved more effectively.

In an embodiment, the organic layer 130 can be formed on the first spacer 150 and the second spacer 160. An electrode and an inorganic layer can be formed on the organic layer 130. The electrode formed on the organic layer 130 can be distinguished from the electrode 120. For example, if the electrode 120 is an anode, the electrode formed on the organic layer 130 can be a cathode, or if the electrode 120 is a cathode, the electrode formed on the organic layer 130 can be an anode.

The cover layer 170 can be formed to cover the periphery (e.g., upper and side surfaces) of the first spacer 150 and the second spacer 160, and the organic layer 130. In FIG. 1, the cover layer 170 is briefly illustrated for the purpose of explanation of the present embodiment, but the present disclosure is not limited thereto.

According to an embodiment, at least some of the components (e.g., the passivation layer 110, and/or the electrode 120, and/or the organic layer 130) shown in FIG. 1 can be omitted or replaced with other components. In addition, the display device according to the embodiment of the present disclosure is not limited to an OLED device or an LCD device, and can be applied to various devices including a spacer.

Figure 2:
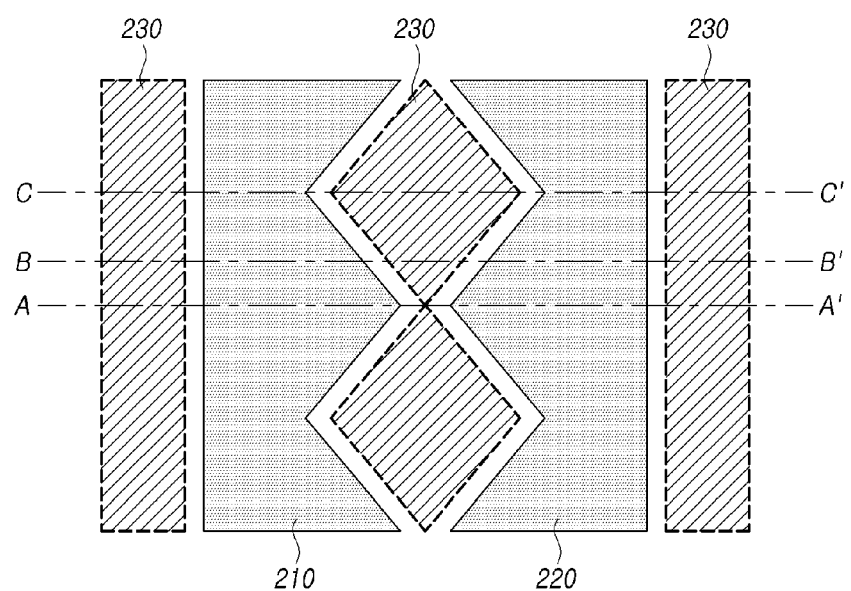
FIG. 2 is a diagram a mask for forming a spacer of a display device according to an embodiment of the present disclosure.

FIG. 2 is a diagram for explaining a spacer of a display device and a mask for forming the spacer according to an embodiment of the present disclosure. Specifically, FIG. 2 conceptually illustrates a plan view of a state in which a mask (or photomask) is disposed to form a spacer on a bank during a manufacturing process of a display device according to the embodiment of the present disclosure. FIG. 2 can be a plan view corresponding to a portion in which the bank of FIG. 1 is disposed.

Specifically, FIG. 2 can be a plan view corresponding to a bank area in which a set of spacers (e.g., the first spacer 150 and the second spacer 160 of FIG. 1) are disposed, and shows a mask 230 which can be used to form the first and second spacers 150 and 160 corresponding respectively to first and second areas 210 and 220 of the mask 230. The set of spacers can also be referred to as a spacer structure assembly as mentioned below.

Referring to FIG. 2, the mask 230 can have a shape corresponding to the variation in a separation distance between the first spacer and the second spacer so that the separation distance between the first spacer and the second spacer can be varied. For example, as shown, the mask 230 in a central region is formed (or patterned) to have a form in which rhombuses are arranged or a form in which zigzag lines face each other, and the mask 230 in an edge region can be formed to have the form of a straight line.

According to an embodiment, the mask 230 in the central region can be implemented in various forms in which the shape of the periphery thereof is continuously changed in addition to the form in which the rhombuses are arranged as shown in FIG. 2. For example, the mask 230 in the central region can be implemented in a form in which ellipses are arranged. A more specific example of implementing the mask 230 in the central region in the form in which the ellipse is arranged can be referred to FIG. 7.

The mask 230 is a pattern for shielding light, and can correspond to a photomask used in an exposure process. FIG. 2 illustrates a part of the mask 230 for convenience of description, and the mask can be formed in the form of extending or arranging patterns as shown in FIG. 2. However, the present disclosure is not limited thereto, and can be implemented as a mask of various sizes and shapes including the pattern of the mask 230 shown in FIG. 2.

The mask 230 includes the first area 210 and the second area 220 which can be an opening area of the mask 230, so that the first and second areas 210 and 220 can basically be thru holes or open areas. For example, a material constituting the mask 230, for example, a metal material (e.g., CrOx, Cr) may be not disposed in the first area 210 and the second area 220, so that the first area 210 and the second area 220 can be perforated or exposed. In this case, when light is irradiated on the mask 230, the light can go through the first and second areas 210, 220 since there is nothing there and can then reach a layer/material disposed below the mask 230 under the first area 210 and the second area 220. In the central region and the edge region where the material/layer of the mask 230 is actually present, light can be blocked by the material/layer of the mask 230, so that light may not reach a material/layer disposed under the mask 230. An example of the material or layer that can be disposed under the mask 230 is a photoresist or photosensitizer.

In an embodiment, a lithography process or a photolithography process can be performed in manufacturing the display device. The photolithography process is a process for etching a specific material/layer into a desired pattern. Generally, a photoresist (PR) (or photosensitizer) can be applied on the material to be etched, a mask can be placed on the photoresist, and then light exposure can be performed on the mask to form a pattern of the photoresist. In this case, the chemical properties of the portion exposed to light can change according to the material properties of the photoresist. The material properties of the photoresist can be classified as a positive type and a negative type. A positive type photoresist has a property of softening (or dissolving) a portion exposed to light. A negative type photoresist has a characteristic in which a portion exposed to light is cured (or hardened). In some cases, a portion which is not exposed to light can be etched to form a pattern. In some other cases, the portion exposed to light can be etched to form a pattern. The photolithography process and the material properties of the photoresist can be implemented within the range apparent to those skilled in the art, and are not limited to the above-described examples of the present disclosure.

In an embodiment, a photoresist of a predetermined type can be provided under the mask 230. For example, a negative type photoresist can be disposed under the mask 230. Since the first area 210 and the second area 220 are opening areas (open areas) of the mask 230, the first area 210 and the second area 220 can be exposed to light by the photolithography process. In this case, the portion exposed to light can be cured, i.e., the portion of the photoresist under the first and second areas 210 and 220 of the mask 230 can be cured and formed. Accordingly, a first spacer can be formed in or under the first area 210 and a second spacer can be formed in or under the second area 220 in a shape corresponding to the portion exposed to light.

In an embodiment, the spacer can be implemented using a negative type photoresist as a material. When forming the spacer, a height of the spacer can be predetermined to be constant. In this case, the exposure amount can be controlled. For example, the exposure amount can be controlled to be inversely proportional to the separation distance between the first spacer and the second spacer (or the distance between the first spacer and the second spacer). For another example, the exposure amount can be controlled to be inversely proportional to a taper angle (an angle formed between a lower surface and a side surface of the spacer) of one or more of the first spacer and the second spacer.

In another embodiment, the exposure amount associated with the forming of the spacer can be constant. In this case, a height of the spacer can be proportional to a separation distance between the first spacer and the second spacer or a taper angle of one of the first spacer and the second spacer. In this case, the height of the spacer can be set to be included within a predetermined range. For example, if the exposure amount is constant, the spacer can be formed in such a way that the height of the spacer is determined in consideration of the separation distance and the taper angle.

In an embodiment, the size of the spacer can be different for each position (e.g., each area or location). For example, the size of the spacer corresponding to each of the cross-section along line A-A', the cross-section along line B-B', and the cross-section along line C-C' of FIG. 2 can be different from each other. A specific example of the cross-section along line A-A' of FIG. 2 will be described with reference to FIG. 3, a specific example of the cross-section along line B-B' of FIG. 2 will be described with reference to FIG. 4, and a specific example of the cross-section along line C-C' of FIG. 2 will be described with reference to FIG. 5.

Here, the size of the spacer can be referred to a width of the spacer, for example, at least one of a width of an upper surface and a width of a lower surface. However, the present disclosure is not limited thereto, and for example, there can be used various indicators corresponding to a distance between one end and the other end of the spacer. A specific example related to the width of the spacer will be described below with reference to FIGS. 3 to 5.

According to an embodiment, a lower surface of the spacer can be referred to as a first side adjacent to the bank (e.g., side that is contacting the bank), and an upper surface of the spacer can be referred to as a second side opposite to the first side. In this case, since the spacer is implemented in an inverse tapered shape, the width of the first side adjacent to the bank of the spacer can be smaller than the width of the second side opposite to the first side.

In an embodiment, a height of each of the first spacer and the second spacer at a first area can correspond to (more specifically, be equal to) a height of each of the first spacer and the second spacer at a second area. For example, the height of each of the first spacer and the second spacer in the cross-section area along line A-A' of FIG. 2 can correspond to (more specifically, be equal to) the height of each of the first spacer and the second spacer in the cross-section area along line B-B' of FIG. 2.

In addition, various numerical values illustrated through FIGS. 3 to 5 below are examples for convenience of description, and thus the present disclosure is not limited to these examples.

FIG. 2 can be an enlarged view of a portion of a mask associated with a spacer structure assembly or a set of spacers. If a plurality of spacer structure assemblies or a plurality of sets of spacers are formed through the mask, the mask can be formed in a form in which a plurality of portions as shown in FIG. 2 exist.

Figure 3:
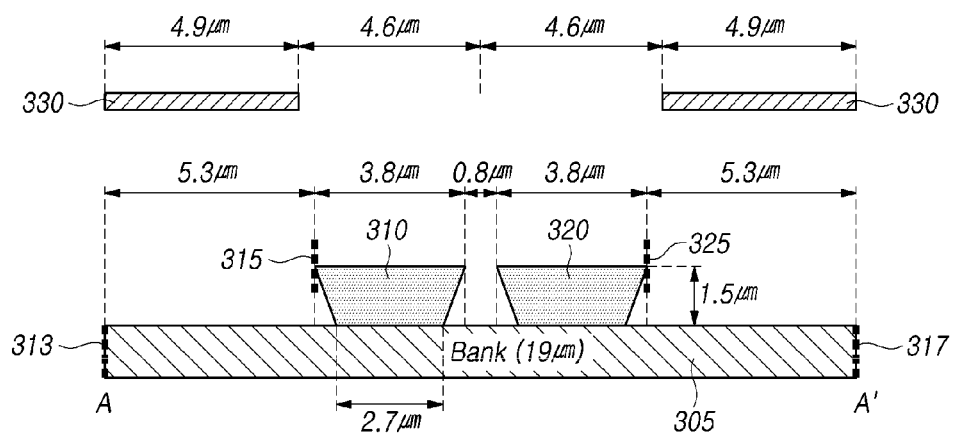
FIG. 3 is a diagram illustrating a cross-section corresponding to a first area of a display device, along line A-A' of FIG. 2, according to an embodiment of the present disclosure.

FIG. 3 is a diagram for explaining a cross-section corresponding to a first area of a display device according to an embodiment of the present disclosure. Specifically, FIG. 3 illustrates an example of a cross-section along line A-A' in FIG. 2. Here, a mask 330 in FIG. 3 can correspond to the mask 230 along line A-A' in FIG. 2.

Referring to FIG. 3, the mask 330 can be disposed on a bank (or insulating layer) 305. A first spacer 310 and a second spacer 320 can be disposed in an area where the mask 330 is not disposed. When or after the first spacer 310 and the second spacer 320 are formed, the mask 330 can be removed. However, in the present embodiment, for convenience of explanation, there is illustrated as a state in which the mask 330 is arranged, however, the present embodiment is not limited thereto.

The mask 330 shown in FIG. 3 can be formed in an edge region. For example, the mask 330 may not be disposed in a central region since the cross-section along line A-A' of FIG. 2 is a cross-section with respect to the vertex portion of the rhombus shape, Accordingly, there can be implemented as a state in which the separation distance between the first spacer 310 and the second spacer 320 is minimized. For example, the separation distance between the first spacer 310 and the second spacer 320 can be 0.8 µm.

In the case that the width of the mask in the central region does not change, for example, if the shape of the mask in the central region is implemented in a straight shape (or a rectangular shape or a stripe shape), a minimum separation distance between the first spacer and the second spacer can be greater than a minimum separation distance according to an embodiment of the present disclosure. For example, if there is no change in the width of of the mask in the central region, the minimum separation distance between the first spacer and the second spacer can be 1 µm or more.

On the other hand, in the case that the width of the mask in the central region changes as in the embodiment of the present disclosure, a minimum separation distance between the first spacer and the second spacer can be 0.8 µm. For example, according to the embodiment of the present disclosure, as a distance between at least two spacers, especially two spacers formed in double lines (or rows) decreases, the width of the bank can be reduced. Accordingly, a portion of the light emitting layer covered by the bank is decreased, and thus the resolution of the display device can be improved.

Referring to the drawings, the first spacer 310 and the second spacer 320 can each have an inverse tapered shape. Here, the inverse tapered shape is an inverted trapezoidal shape, and for example, a width of the upper surface of each of the first spacer 310 and the second spacer 320 can be formed to be greater than a width of the lower surface thereof. More specifically, for example, the width of the lower surface of each of the first spacer 310 and the second spacer 320 can be 2.7 µm, the width of the upper surface thereof can be 3.8 µm, and the height thereof can be 1.5 µm.

In an embodiment, a distance between one end 315 of the first spacer 310 and one end 313 of the bank 305 can correspond to (more specifically, be equal to) a distance between one end 325 of the second spacer 320 and the other end 317 of the bank 305, and can be 5.3 µm. In some cases, referring to the drawings, a distance between one end 315 of the first spacer 310 and one end 313 of the bank 305 can be interpreted as a minimum distance between an extension line extending one end 315 of the first spacer 310 and an extension line extending one end 313 of the bank 305. In addition, a distance between one end 325 of the second spacer 320 and the other end 317 of the bank 305 can be interpreted as the minimum distance between an extension line extending one end 325 of the second spacer 320 and an extension line extending the other end 317 of the bank 305.

In an embodiment, a width of the mask 330 disposed in the edge region can be maintained constant despite a change in the shape of the mask 330 disposed in the central region, and can be 4.9 µm. For example, the width of the mask 330 disposed in the edge region can appear to be constant in FIGS. 4 and 5 to be described later.

In an embodiment, the distance between one end 315 of the first spacer 310 and one end 313 of the bank 305 and the distance between one end 325 of the second spacer 320 and the other end 317 of the bank 305 can be maintained constant despite the change in size (or width) of the first spacer 310 and the second spacer 320. For example, the positions of one end 315 of the first spacer 310 and one end 325 of the second spacer 320 can be constantly maintained on the bank.

In an embodiment, the first spacer 310 and the second spacer 320 can be implemented in shapes corresponding to each other. For example, a width of the upper surface, a width of the lower surface, a height, and a taper angle of each of the first spacer 310 and the second spacer 320 can be implemented to be the same, however, are not limited thereto, and can be implemented differently within an error range or according to design needs.

Figure 4:
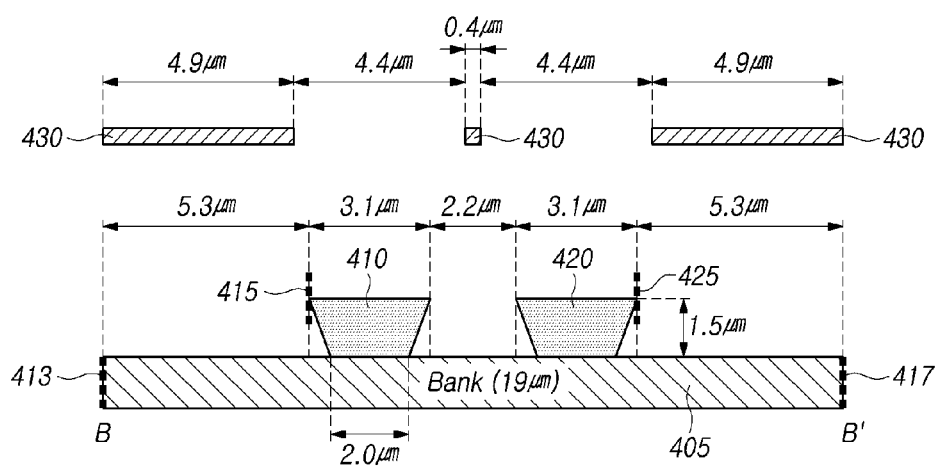
FIG. 4 is a diagram illustrating a cross-section corresponding to a second area of a display device, along line B-B' of FIG. 2, according to an embodiment of the present disclosure.

FIG. 4 is a diagram for explaining a cross-section corresponding to a second area of a display device according to an embodiment of the present disclosure. Specifically, FIG. 4 illustrates an example of a cross-section along line B-B' of FIG. 2. Here, a mask 430 in FIG. 4 can correspond to the mask 230 along line B-B' in FIG. 2.

Hereinafter, in relation to FIG. 4, there will be omitted the content overlapping with the content described in FIG. 3, or such overlapping content may be briefly or partially discussed.

Referring to FIG. 4, the mask 430 can be formed in the edge region and the central region, and the width of the mask 430 in the central region can be 0.4 µm. Accordingly, a separation distance between a first spacer 410 and a second spacer 420 can be increased compared to the case of FIG. 3. For example, the separation distance between the first spacer 410 and the second spacer 420 can be 2.2 µm.

In an embodiment, each of the first spacer 410 and the second spacer 420 can be implemented in an inverse tapered shape. However, a width of at least one of an upper surface and a lower surface of a spacer constituting the inverse tapered shape can be changed as a portion of the mask 430 is disposed in the central region and the separation distance between the spacers increases. For example, a width of the upper surface of each of the first spacer 410 and the second spacer 420 can decrease in response to an increase in the separation distance between the first spacer 410 and the second spacer 420. As another example, a width of the lower surface of each of the first spacer 410 and the second spacer 420 can decrease in response to an increase in the separation distance between the first spacer 410 and the second spacer 420. As another example, the width of the upper surface of each of the first spacer 410 and the second spacer 420 can decrease in response to an increase in a width of the mask 430 disposed in the central region.

In an embodiment, despite the change in a separation distance between the first spacer 410 and the second spacer 420 and the width of the upper surface or the lower surface, a distance between one end 413 of the bank 405 and one end 415 of the first spacer 410 and a distance between the other end 417 of the bank 405 and one end 425 of the second spacer 420 can be maintained to be constant or same. For example, the distance between one end 413 of the bank 405 and one end 415 of the first spacer 410 and the distance between the other end 417 of the bank 405 and one end 425 of the second spacer 420 can be maintained to be the same as in the case of FIG. 3.

Figure 5:
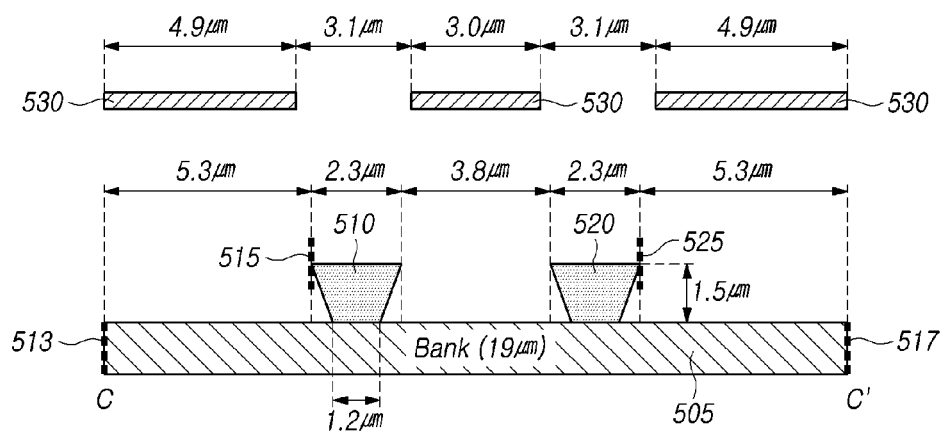
FIG. 5 is a diagram illustrating a cross-section corresponding to a third area of a display device, along line C-C' of FIG. 2, according to an embodiment of the present disclosure.

FIG. 5 is a diagram for explaining a cross-section corresponding to a third area of a display device according to an embodiment of the present disclosure. Specifically, FIG. 5 illustrates an example of a cross-section along line C-C' of FIG. 2. Here, a mask 530 in FIG. 5 can correspond to the mask 230 along line C-C' in FIG. 2.

Hereinafter, in relation to FIG. 5, there will be omitted the content overlapping with the content described in FIG. 3 or FIG. 4 or such overlapping content may be briefly or partially discussed.

Referring to FIG. 5, the mask 530 can be formed in the edge region and the central region as in FIG. 4, and the width of the mask 430 in the central region can be 3.0 μm. That is, in the case of FIG. 5, the width of the mask 530 disposed in the central region can be increased more than in the case of FIG. 4. Accordingly, a separation distance between a first spacer 510 and a second spacer 520 can be increased compared to the case of FIG. 4. For example, the separation distance between the first spacer 510 and the second spacer 520 can be 3.8 μm.

In an embodiment, each of the first spacer 510 and the second spacer 520 can be implemented in an inverse tapered shape. However, a width of at least one of the upper and lower surfaces of the spacer constituting the inverse tapered shape can be changed as the width of the mask 530 disposed in the central region changes. For example, the width of the upper surface of each of the first spacer 510 and the second spacer 520 can decrease in response to an increase in the separation distance between the first spacer 510 and the second spacer 520. As another example, the width of the lower surface of each of the first spacer 510 and the second spacer 520 can decrease in response to an increase in the separation distance between the first spacer 510 and the second spacer 520. As another example, the width of the upper surface of each of the first spacer 510 and the second spacer 520 can decrease in response to an increase in the width of the mask 530 disposed in the central region.

In the embodiment, despite the change in the separation distance between the first spacer 510 and the second spacer 520 and the width of the upper surface or the lower surface, a distance between one end 513 of a bank 505 and one end 515 of the first spacer 510 and a distance between the other end 517 of the bank 505 and one end 525 of the second spacer 520 can be maintained constant or same. For example, a distance between one end 513 of the bank 505 and one end 515 of the first spacer 510 and a distance between the other end 517 of the bank 405 and one end 525 of the second spacer 520 can be kept the same as in the case of FIG. 3 or FIG. 4.

As described above, FIGS. 3 to 5 are cross-sectional views of the display device at three area, i.e., along lines A-A', B-B', and C-C' in FIG. 2. In this regard, the mask 330 of FIG. 3, the mask 430 of FIG. 4, and the mask 530 of FIG. 5 can be different masks. Alternatively, at least one of the mask 330 of FIG. 3, the mask 430 of FIG. 4, and the mask 530 of FIG. 5 can be a different mask from the others. Alternatively, the mask 330 of FIG. 3, the mask 430 of FIG. 4, and the mask 530 of FIG. 5 can be different parts of one mask (e.g., the mask 230 of FIG. 2).

In addition, the bank 305 of FIG. 3, the bank 405 of FIG. 4, and the bank 505 of FIG. 5 can be different banks (i.e., separate banks). Alternatively, at least one of the bank 305 of FIG. 3, the bank 405 of FIG. 4 and the bank 505 of FIG. 5 can be a different bank from the others. Alternatively, the bank 305 of FIG. 3, the bank 405 of FIG. 4, and the bank 505 of FIG. 5 can be different parts of one bank (e.g., the bank 140 of FIG. 1).

In addition, the first spacer 310 of FIG. 3, the first spacer 410 of FIG. 4 and the first spacer 510 of FIG. 5 can be disposed in or under the first area 210 of FIG. 2, and can be different first spacers. Alternatively, at least one of the first spacer 310 of FIG. 3, the first spacer 410 of FIG. 4 and the first spacer 510 of FIG. 5 can be a first spacer different from the others. Alternatively, the first spacer 310 of FIG. 3, the first spacer 410 of FIG. 4 and the first spacer 510 of FIG. 5 can be different parts in one and the same first spacer (e.g., first spacer 150 in FIG. 1).

In addition, the second spacer 320 of FIG. 3, the second spacer 420 of FIG. 4 and the second spacer 520 of FIG. 5 can be disposed in or under the second area 220 of FIG. 2, and can be different second spacers. Alternatively, at least one of the second spacer 320 of FIG. 3, the second spacer 420 of FIG. 4 and the second spacer 520 of FIG. 5 can be a second spacer different from the others. Alternatively, the second spacer 320 of FIG. 3, the second spacer 420 of FIG. 4 and the second spacer 520 of FIG. 5 can be different parts in one and the same second spacer (e.g., second spacer 160 in FIG. 1).

Figure 6:
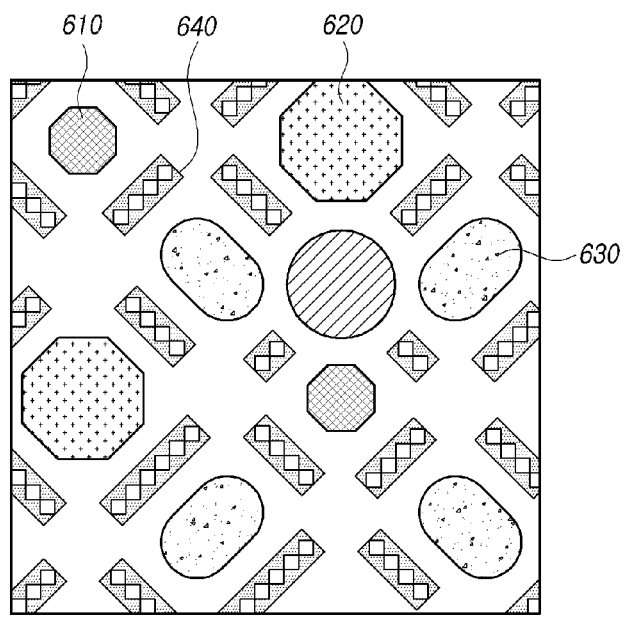
FIG. 6 is a diagram of a spacer and a luminous element of a display device according to an embodiment of the present disclosure.

FIG. 6 is a diagram illustrating the arrangement of a spacer and a luminous element of a display device according to an embodiment of the present disclosure. Specifically, FIG. 6 conceptually illustrates a plane in which a plurality of spacers (or a plurality of spacer structure assemblies) formed in two rows (or double lines) respectively are disposed.

Referring to FIG. 6, a spacer (or spacer structure assembly) 640 can be disposed adjacent to and between luminous elements 610, 620 and 630. In an embodiment, the luminous elements 610, 620 and 630 can be included in the organic layer 130 of FIG. 1. The luminous elements 610, 620 and 630 are illustratively illustrated in order to describe the plane on which the spacer 640 is disposed in a wider range, and the present embodiment is not limited thereto.

In an embodiment, the spacer 640 can be disposed to have a predetermined (pre-specified) separation distance from the luminous elements 610, 620 and 630. In this case, a position at which the spacer 640 is disposed can be predetermined. For example, the spacer 640 can be disposed at a predetermined position to have a predetermined (pre-specified) separation distance above, below, left, and right of the luminous elements 610, 620 and 630 as shown. In addition, an arrangement angle or arrangement form of the spacers 640 with respect to the luminous elements 610, 620 and 630 can be predetermined.

In some cases, the spacer 640 can be disposed to have a predetermined separation distance from an opening. In this case, the opening can correspond to a region in which the luminous elements 610, 620 and 630 are formed.

In an embodiment, the spacer 640 can include a first spacer and a second spacer, and the first spacer and the second spacer can be arranged in two rows in parallel. The separation distance between the first spacer and the second spacer can be implemented in a form indicating an increase or decrease. Due to the change in the separation distance, an intermediate plane or an intermediate space (the space between the first spacer and the second spacer) viewed from above the first spacer and the second spacer can have a rhombus shape as illustrated.

A bank can be disposed at the lower end of the spacer 640. The cross-section of the spacer 640 can be implemented in an inverse tapered shape, and the width of the upper surface or the lower surface of the spacer can be changed according to a change in the distance between the two spacers (for example, the first spacer and the second spacer) arranged in two rows (or double lines), for example, the separation distance.

As described above, each spacer 640 illustrated in FIG. 6 can be a spacer structure assembly including a first spacer and a second spacer spaced apart from each other, and can be disposed between two adjacent luminous elements (or two pixels or two light emitting regions) of the display device.

The separation distance between the first spacer and the second spacer included in each spacer 640 illustrated in FIG. 6 is not constant, and can vary depending on the position/area. To this end, the width of the first spacer included in each spacer 640 illustrated in FIG. 6 may not be uniform as shown in FIGS. 3 to 5, and can vary according to positions. In addition, the width of the second spacer included in each spacer 640 illustrated in FIG. 6 may not be uniform as shown in FIGS. 3 to 5, and can vary according to positions/areas. For instance, the spacer 640 can include the configuration of the first and second spacers discussed above (e.g., 150 & 160 in FIG. 1, 310 & 320 in FIG. 3, 410 & 420 in FIG. 4, 510 & 520 in FIG. 5).

FIG. 6 illustrates an example (example of linear change) of a change in the separation distance between the first spacer and the second spacer included in each spacer 640, for example, which illustrates a case in which an intermediate plane or an intermediate space (a space between the first spacer and the second spacer) is implemented in a rhombus shape. However, the present disclosure is not limited thereto, and the space shape (e.g., rhombus, elliptical, circular, etc.) between the first spacer and the second spacer can vary depending on the shape of the change in the separation distance between the first spacer and the second spacer. It will be described another example (an example of a non-linear change) of a change in the separation distance between the first spacer and the second spacer in more detail with reference to FIG. 7.

Figure 7:
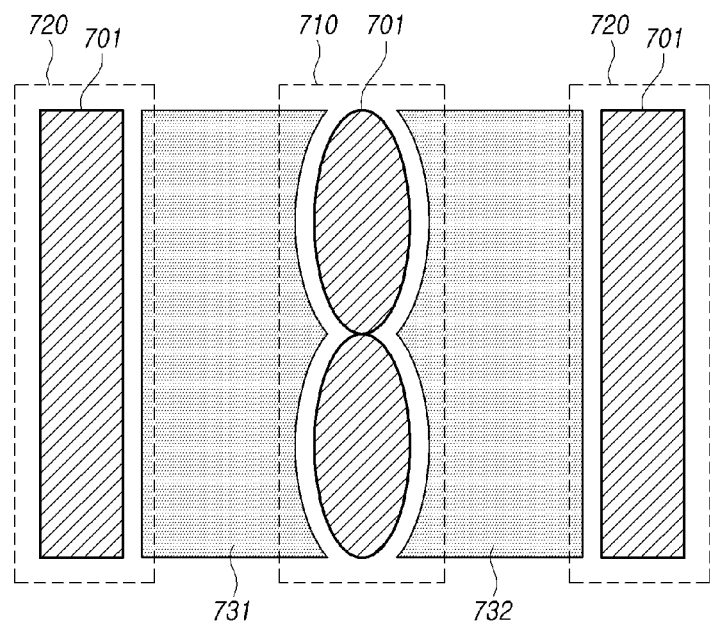
FIG. 7 is a diagram a mask for forming a spacer of a display device according to another embodiment of the present disclosure.

FIG. 7 is a diagram for explaining a spacer of a display device and a mask for forming the spacer according to another embodiment of the present disclosure.

FIG. 7 illustrates an example in which the change of the separation distance is implemented in a form different from that of FIG. 2 or FIG. 6. For example, FIG. 7 illustrates a case in which the degree of change in the separation distance between the first spacer and the second spacer is smaller than that of FIG. 2 or 6. In this case, as shown, a mask 701 in a central region 710 can have a shape in which ellipses are arranged. In this case, the separation distance between the first spacer and the second spacer at different positions/areas can be different.

In an embodiment, the mask 701 in an edge region 720 can have a straight line or a rectangular shape. For example, the shape of the mask 701 in the edge region 720 can be maintained constant independent of the degree of change in the separation distance.

Since the mask 701 in the central region 710 has a shape in which ellipses are arranged, if there is a change in the separation distance between the first spacer and the second spacer, the width of the upper surface or the lower surface of the first spacer and the second spacer can also change in response to the change in the separation distance. For example, as the separation distance increases, the width of the upper surface or the lower surface of the first spacer and the second spacer can decrease.

A first area 731 and a second area 732 of the mask 701 can be an opening area (e.g., open area) of the mask 701. For example, a material/layer constituting the mask 701, for example, a metal material (e.g., CrOx, Cr) may be not disposed in the first area 731 and the second area 732, so that the first area 731 and the second area 732 can be perforated or exposed. In this case, when light is irradiated over the mask 701, the light can reach a material/layer (e.g., photoresist) disposed under each of the first area 731 and the second area 732 of the mask 701. In the central region and the edge region where the mask 701 is disposed, light can be blocked by the mask 701, so that light may not reach the material (i.e., photoresist) disposed under the mask 701. Since the content (for example, the way or method) of forming the spacer using light exposure has been described above, it will be omitted a detailed description thereof.

Figure 8:
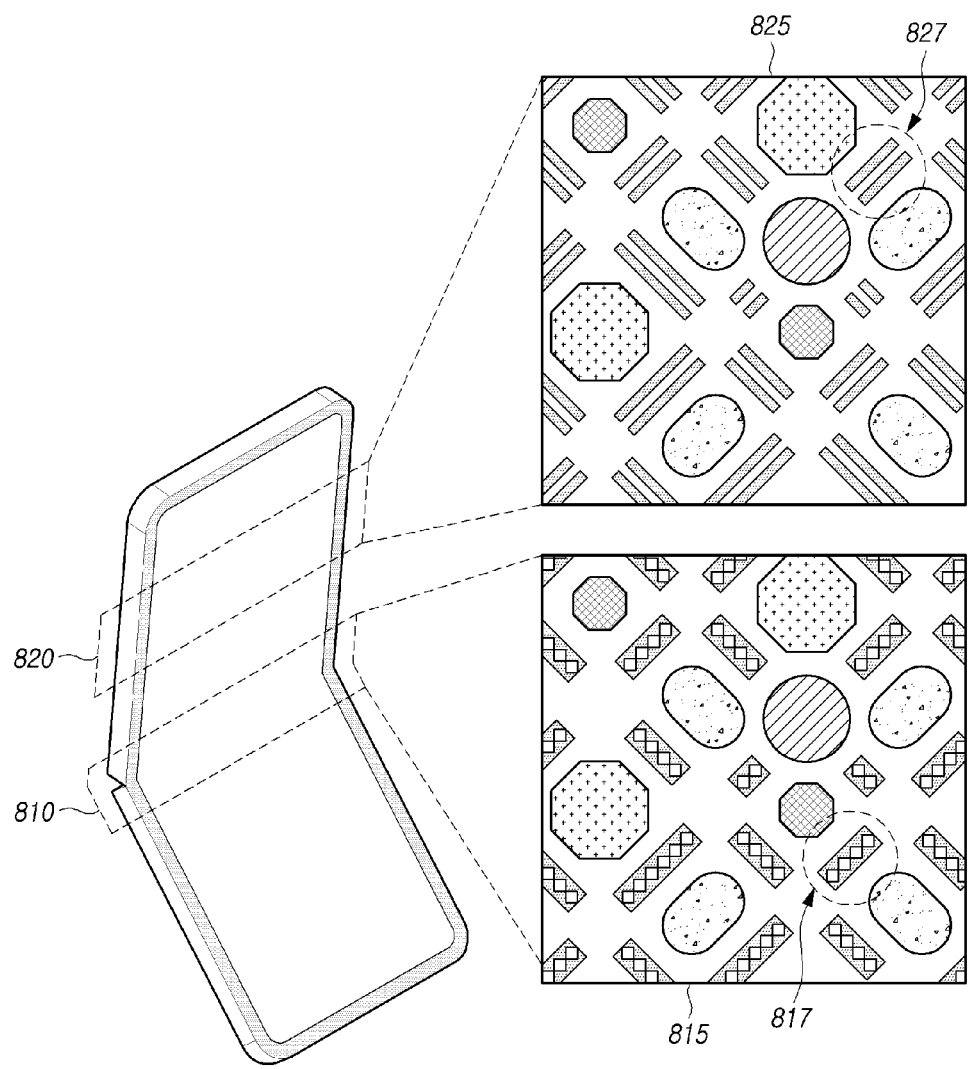
FIG. 8 is a diagram for explaining an application example of a display device according to an embodiment of the present disclosure.

FIG. 8 is a diagram for explaining an application example of a display device according to an embodiment of the present disclosure. Specifically, FIG. 8 illustrates an example of a display device to which a spacer is applied according to an embodiment of the present disclosure.

Referring to FIG. 8, a mobile terminal can be implemented as a display device including a display in which a display panel is arranged as a main element thereof. As illustrated, a part of the mobile terminal (hereinafter, the display device) can be folded or bent, and in this case, an active area of the display device may be deformed in response to the folding or bending of the display device.

According to an embodiment, the display device can include a folded area 810 and a flat area 820. The reference numeral 815 indicates an enlarged example of the spacer arrangement portion in the folded area 810. The reference numeral 825 indicates an enlarged example of the spacer arrangement portion in the flat area 820.

The folded area 810 can include a spacer structure assembly 817 comprising at least two spacers which are formed in a row respectively and exhibit a change in separation distance from each other. In this case, there can be minimized a peeling of the luminous elements (or the light emitting layer) that can occur due to the folding of the folded area 810. The flat area 820 can include a spacer structure assembly 827 comprising at least two spacers formed in rows and having a constant separation distance therebetween.

In an embodiment, the folded area 810 and the flat area 820 can be predetermined in advance. For example, the folded area 810 can be predetermined to correspond to an area where a pressure is generated due to folding, and the flat area 820 can be predetermined as a display area excluding the folded area 810.

In some cases, the folded area 810 can include a predetermined area including the outermost portion of the display area or a predetermined area including a portion in which a hole is formed in the display area.

The spacer structure assembly 817 includes at least two spacers formed in a row respectively and having a change in separation distance from each other is disposed in the folded area 810, but the present disclosure is not limited thereto. In some case, the spacer structure assembly 817 comprising at least two spacers can be disposed in at least a portion of the flat area 820. The spacer structure assembly 817 can have the same or similar configuration as the spacer structure assembly 640 in FIG. 6.

Meanwhile, the present disclosure illustrates a case in which two spacers are formed in a spacer structure assembly as an example, but the present disclosure is not limited thereto, and two or more spacers can be formed in a spacer structure assembly (specifically, in one and the same spacer structure assembly). In addition, if two or more spacers are formed in a spacer structure assembly, the distance between adjacent spacers can correspond to the separation distance, and accordingly, the arrangement or size of the spacers can be designed to implement a change in the separation distance.

FIG. 9 illustrates a flowchart explaining a manufacturing method of a display device according to an embodiment of the present disclosure. Each step of the manufacturing method illustrated in FIG. 9 can be performed in a different order from that illustrated in the drawings in some cases. In addition, in the following, it will be omitted or briefly provided the content overlapping with the previously described content. The method of FIG. 9 can be used to form the display devices of the embodiments of the present disclosure discussed herein.

Referring to FIG. 9, in step 910, a thin film transistor can be disposed on a substrate. The substrate is a plate on which various components of the display device are formed, and various known substrates can be used. The thin film transistor is a transistor formed using a thin film and can be configured to control light emission from a display device.

In step 920, a bank can be disposed on the thin film transistor. The bank can be configured to divide pixels. However, the present disclosure is not limited thereto, and the bank can perform additional functions within a range understandable to those of ordinary skill in the art not described in this disclosure.

In step 930, a photoresist, for example a photoresist of a negative type, can be disposed (or applied) on the bank. The photoresist of the negative type can be a photoresist that cures when exposed to light. The photoresist of the negative type can use, for example, an epoxy-based polymer, but is not limited thereto.

In step 940, a photolithography or a light exposure for the photoresist can be performed by using a mask corresponding to the shape of a spacer structure assembly comprising at least two spacers (e.g., a first spacer and a second spacer) having different separation distances from each other at a first area and at a second area. Specifically, the distance between the at least two spacers at the first area and the distance between the at least two spacers at the second area can be different from each other. The light exposure can be performed using a mask reflecting a distance difference between the first area and the second area. An example of the mask can be the mask of FIG. 2 or FIG. 7.

Here, the first area can correspond to one cross-section of at least two spacers configured in at least two rows. The second area can correspond to another or a different cross-section of the at least two spacers configured in at least two rows.

In an embodiment, when light exposure is performed in a state in which the mask is disposed, the light reaches an exposed portion of the photoresist in the region of the mask, so that the exposed portion of the photoresist can be cured. The mask can be removed after light exposure is performed, and etching can be performed on the remaining uncured region. A cured portion can thus remain on the bank, which can correspond to a spacer according to one or more embodiments of the present disclosure.

The display device according to an embodiment of the present disclosure includes a spacer structure assembly comprising at least two spacers each having an inverse tapered shape and arranged in at least two rows, so that it is possible to minimize or eliminate possible deformation which may occur due to pressure applied to the display device, by improving the adhesion of the light emitting layer of the display device.

In addition, in the manufacturing method of a display device according to an embodiment of the present disclosure, a spacer structure assembly comprising at least two spacers is formed using a mask of a pattern in which the width of the central region thereof changes, so that it is possible to minimize a distance between the at least two spacers, for example, a separation distance. The width (or area) of the bank can also be reduced by minimizing the separation distance, so that the resolution of the display device can be improved.

Although the embodiments of the present disclosure have been described in more detail with reference to the accompanying drawings, the present invention is not necessarily limited to these embodiments, and various modifications can be possible within the scope without departing from the technical spirit of the present invention. Accordingly, the embodiments disclosed in the present disclosure are not intended to limit the technical spirit of the present invention, but to exemplarily explain the present invention, and the scope of the technical spirit of the present invention is not limited by these embodiments. Therefore, there should be understood that the embodiments described above are illustrative in all respects and not restrictive. The protection scope of the present invention should be construed by the following claims, and all technical ideas within the scope equivalent thereto should be construed as being included in the scope of the present invention.

What is claimed is:

1. A display device comprising:
   a thin film transistor disposed on a substrate;
   a bank disposed on the thin film transistor; and
   a spacer structure assembly including at least two spacers disposed on the bank,
   wherein a first separation distance between a first spacer and a second spacer, among the at least two spacers, at a first area of the display device is different from a second separation distance between the first spacer and the second spacer at a second area of the display device, and
   wherein each of the first and second spacers has an inverse tapered shape.

2. The display device of claim 1, wherein the spacer structure assembly is disposed between two adjacent luminous elements, two pixels or two light emitting regions of the display device.

3. The display device of claim 1, wherein each of the at least two spacers is formed in a row having a change in a width and the at least two spacers are arranged side by side on the bank.

4. The display device of claim 1, wherein a separation distance between the at least two spacers is inversely proportional to a width of one surface of the at least two spacers.

5. The display device of claim 4, wherein the one surface of the at least two spacers is an upper surface or a lower surface of one of the at least two spacers.

6. The display device of claim 1, wherein a width of an upper surface or a lower surface of one of the at least two spacers decreases in response to an increase in a separation distance between the at least two spacers.

7. The display device of claim 1, wherein a height of each of the first and second spacers at the first area is equal to a height of each of the first and second spacers at the second position.

8. The display device of claim 1, wherein a distance between one end of the first spacer and one end of the bank is equal to a distance between one end of the second spacer and the other end of the bank.

9. The display device of claim 1, wherein the at least two spacers are formed by using a photoresist of a negative type, or
wherein an exposure amount for forming the at least two spacers is inversely proportional to a separation distance between the at least two spacers or a taper angle of one of the at least two spacers.

10. The display device of claim 1, wherein a height of one of the first and second spacers is proportional to the first or second separation distance or a taper angle of the one of the first and second spacers.

11. The display device of claim 1, wherein the first area corresponds to a cross-section of the first and second spacers configured in at least two rows, and the second area corresponds to another cross-section of the first and second spacers.

12. The display device of claim 1, wherein one of the first and second spacers in the first area and the one of the first and second spacers in the second area are different spacers or are different parts in one same spacer.

13. The display device of claim 1, wherein
the at least two spacers have same widths, heights and tape angles, or
the at least two spacers have different widths, heights and/or taper angles.

14. The display device of claim 1, wherein a separated area between the first and second spacers has a rhombus shape, an elliptical shape or a circular shape.

15. The display device of claim 1, further comprising:
a passivation layer disposed on the thin film transistor and on which the bank is disposed;
an electrode disposed on the passivation layer; and
an organic layer disposed on at least a portion of each of the electrode and the bank.

16. The display device of claim 1, wherein the display device includes a folded area and a flat area, and the spacer structure assembly is disposed in the folded area and/or at least a portion of the flat area.

17. A manufacturing method of a display device including a spacer structure assembly, the method comprising:
disposing a thin film transistor on a substrate;
disposing a bank on the thin film transistor;
disposing a photoresist on the bank; and
performing photolithography on the photoresist by using a mask corresponding to a configuration of the spacer structure assembly, and thereby forming the spacer structure assembly including at least two spacers,
wherein a first separation distance between a first spacer and a second spacer, among the at least two spacers, at a first area of the display device is different from a second separation distance between the first spacer and the second spacer at a second area of the display device.

18. The manufacturing method of claim 17, wherein the photoresist is a photoresist of a negative type.

19. The manufacturing method of claim 17, wherein each of the at least two spacers is formed in a row having a change in a width.

20. The manufacturing method of claim 17, wherein a separation distance between the at least two spacers is set to be inversely proportional to a width of one surface of the at least two spacers.

21. The manufacturing method of claim 17, wherein a height of each of the at least two spacers at the first position is set to be equal to a height of each of the at least two spacers at the second position.

22. The manufacturing method of claim 17, wherein a distance between one end of the first spacer and one end of the bank is set to be equal to a distance between one end of the second spacer and the other end of the bank.

23. The manufacturing method of claim 17, wherein each of the first and second spacers is formed to have an inverse tapered shape.

24. The manufacturing method of claim 17, wherein an exposure amount for forming the at least two spacers is set to be inversely proportional to a separation distance between the at least two spacers or a taper angle of one of the at least two spacers.

25. The manufacturing method of claim 17, wherein a height of one of the first and second spacers is set to be proportional to the first or second separation distance or a taper angle of one of the first and second spacers.

* * * * *